United States Patent

Pugel et al.

[11] Patent Number: 5,428,828
[45] Date of Patent: Jun. 27, 1995

[54] TELEVISION RECEIVER TUNING CIRCUIT

[75] Inventors: Michael A. Pugel, Noblesville; William L. Lehmann, Indianapolis, both of Ind.

[73] Assignee: Thomson Consumer Electronics, Inc., Indianapolis, Ind.

[21] Appl. No.: 938,192

[22] Filed: Aug. 28, 1992

[51] Int. Cl.$^6$ ................................. H04B 1/16
[52] U.S. Cl. ........................ 455/191.2; 455/180.4; 348/733
[58] Field of Search ............ 455/180.1, 180.2, 180.4, 455/188.1, 188.2, 191.1, 191.2, 191.3, 340; 348/731, 732, 733; 334/56, 57, 87, 58

[56] References Cited

U.S. PATENT DOCUMENTS

| | | | |
|---|---|---|---|
| 4,160,213 | 7/1979 | Carter | 455/180.4 X |
| 4,326,295 | 4/1982 | Matsumoto | 455/191.3 X |
| 4,598,423 | 7/1986 | Hettiger | 455/191.2 |
| 4,771,332 | 9/1988 | Metoki | 455/191.3 X |
| 4,835,608 | 5/1989 | Lackiw et al. | 348/733 |
| 4,905,306 | 2/1990 | Anderson | 348/731 X |
| 4,972,509 | 11/1990 | Maejima et al. | 455/180 |

FOREIGN PATENT DOCUMENTS 2451133  1/1980  France .................... H03J 5/24

OTHER PUBLICATIONS

Grundig Technische Informationen—vol. 29, No. 3, 1982; "PAL-SECAM-Tuner IF Combination for the CUC Color Television Set Chassis".

Grundig Technische Informationen–vol. 29, No. 3, 1982; "PAL-SECAM-Tuner ZF-Kobination fur das CUC-Farfernsehgerate-Chassis".

*Primary Examiner*—Edward F. Urban
*Attorney, Agent, or Firm*—Joseph S. Tripoli; Peter M. Emanuel; Frederick A. Wein

[57] ABSTRACT

A signal selecting circuit including a first, second and third inductors coupled in series in the order named, a fourth inductor coupled between an output terminal of the third inductor and a reference potential, and varactor diodes responsive to a tuning signal for varying the frequency response of the signal selecting circuit. The signal selecting circuit includes bandswitching circuitry for changing the configuration of the signal selecting circuit in response to the frequency band of the selected signal.

8 Claims, 3 Drawing Sheets

TELEVISION RECEIVER TUNING CIRCUIT

BACKGROUND

The present invention concerns a multiband television tuner of a television receiver having a relatively wide frequency range of tuning. For such multiband tuning, tuners are partitioned into bandswitched sections of frequency ranges. For example, a tuner may include a UHF section for receiving UHF broadcast channels and sometimes "high" cable channels, and a VHF section for receiving VHF broadcast and cable channels with the VHF section being divided into two bands. The bandswitching provisions select different circuit tuning elements for inclusion in the tuning circuit depending upon the frequency band of the selected channel. However, even with bandswitching, it is still a problem to uniformly accommodate the wide range of frequencies across each band, particularly at the frequencies at the edges of the band.

SUMMARY OF THE INVENTION

Briefly, the present invention relates to signal selecting circuit in a signal path coupled between an input terminal and an amplifier, including a first, second and third inductors coupled in series in the order named, a fourth inductor coupled between an output terminal of the third inductor and a reference potential, and varactor diodes responsive to a tuning signal for varying the frequency response of the signal selecting circuit. The signal selecting circuit includes bandswitching circuitry for changing the configuration of the signal selecting circuit in response to the frequency band of the tuned signal.

DESCRIPTION OF THE DRAWINGS

Reference can be had to the drawings wherein like members are designated with like numerals, and wherein.

DETAILED DESCRIPTION OF THE PREFERRED EMBODIMENT

Figure 1:
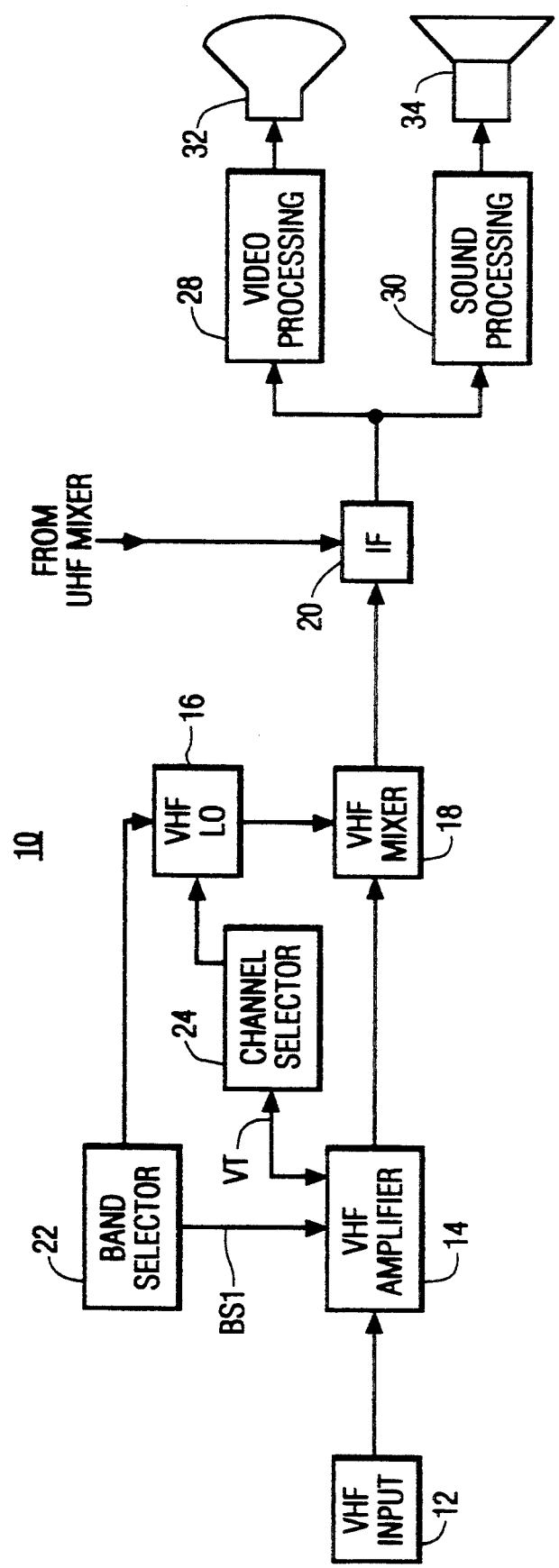
FIG. 1 is a block diagram showing an overview of a television receiver including aspects of the present invention.

Referring now to FIG. 1, VHF signals are coupled to a VHF input terminal 12 of receiver 10 from an appropriate VHF source, e.g., broadcast station or cable, are amplified by a VHF amplifier 14, and are combined, with local oscillator signals generated by a VHF local oscillator (LO) 16, in a VHF mixer 18 to form an IF signal. The IF signal from VHF mixer 18 is processed by IF processing unit 20 in a similar manner to IF signals derived from a UHF tuner section including a UHF mixer (not shown). Channel selector (tuning control) 24 develops a tuning voltage VT for application to varactor diodes and having magnitudes corresponding to respective RF carrier signals applied to VHF amplifier 14. Band selector voltages provided by band selector 22 and channel selector voltages are coupled to the VHF amplifier portion 14 of the receiver. In the exemplary embodiment, the VHF frequencies are divided into two bands, a lower frequency band B1, and a higher frequency band B2, with the switching from band B1 to band B2 being provided by the application of bandswitching voltage BS1.

In operation, when a viewer selects a channel, band selector 22 provides band control signals in accordance with the band in which the selected channel resides. The tuning voltage and bandswitching signals are also coupled to local oscillator 18 which generates a local oscillator signal having a frequency corresponding to the selected channel. The local oscillator signal, coupled to mixer 18, is combined with the selected RF signal to provide sum and difference frequency signals. The frequency of the local oscillator signal is controlled so that the a nominal picture carrier frequency is, e.g., 45.75 MHz in the United States.

The IF signal from mixer 18 is coupled to an IF processing unit 20 where it is amplified and filtered. The output signal of IF processing unit 20 is coupled to a video processing unit 28 and to a sound processing unit 30. Video processing unit 28 processes chrominance, luminance, and synchronization signals derived from the IF signal to form an image on kinescope 32 while sound processing unit 30 processes the sound signals derived from the IF signal which are converted to audible signals by loudspeakers 34.

Figure 2:
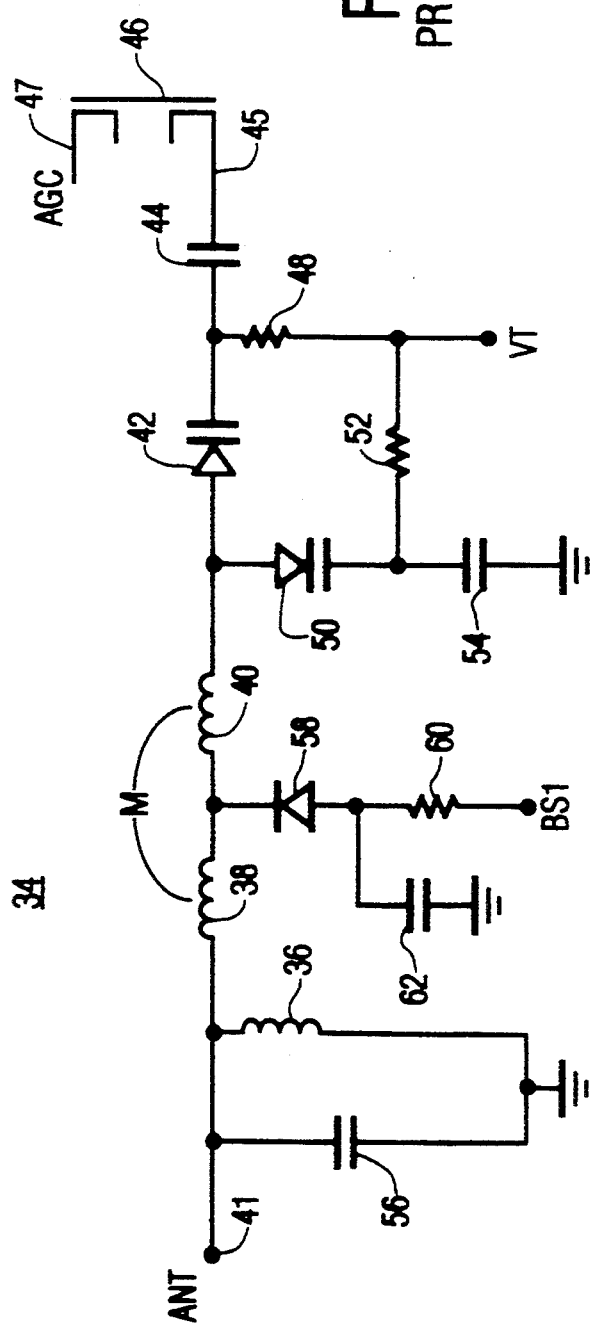
FIG. 2 is a schematic of a prior art tuning circuit used in the VHF amplifier of FIG. 1.

Referring now to FIG. 2, there is shown a prior art tuning circuit for VHF amplifier 14. Tuning circuit 34 includes three inductors, i.e., input shunting inductor 36, series inductors 38, 40, and a varactor diode 42 connected, in the order named, between signal input terminal 41, via a DC isolation capacitor 44, to the gate electrode 45 of RF amplifier dual gate FET (field effect transistor) 46. Capacitor 56 coupled across the inductor 36 is a small value capacitor of about 2 pf (picofarads) for trimming the circuit. A varactor diode 50 is coupled from the junction of varactor diode 42 and inductor 40 to ground through capacitor 54 which has no appreciable impedance at the frequencies of interest. The tuning voltage VT, from channel selector 24, is coupled to the cathode of varactor diode 42 through an isolation resistor 48, and is further coupled to the cathode of varactor diode 50 through isolation resistor 52. Thus, the capacitances of the respective varactor diodes 42, 50 are changed according to the tuned channel. Inductor 36 provides a DC return path for varactor diodes 42 and 50.

Figure 2A:
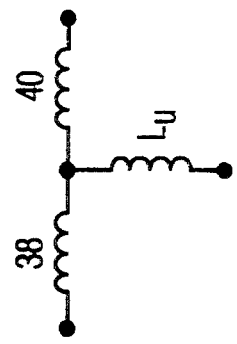

Inductors 38 and 40 have a mutual inductance coupling and act to produce the equivalent of a mutual inductor Lm between their junction. This equivalent circuit is shown in FIG. 2a. The value of the inductance Lm is determined by the values of inductors 38 and 40, and the mutual coupling between inductors 38 and 40. As a practical matter, the maximum value of mutual coupling is about 0.8 for air core inductors thus placing an upper limit on the value of inductance Lm.

Bandswitching is accomplished as follows: The cathode of bandswitching PIN diode 58 is coupled to the junction of inductors 38 and 40 with the anode receiving bandswitching signal BS1 via resistor 60 from band selector 22. Capacitor 62 has a relatively large value and is essentially a bypass capacitor for the VHF signal when diode 58 is conducting, and a filter capacitor for the bandswitching signal BS1. When a channel in band B2 is selected, the bandswitch signal BS1 is caused to be at a relatively high positive voltage level, causing diode 58 to conduct through resistor 60 and through inductors 38 and 36. This conduction of diode 58 couples the equivalent mutual inductance Lm ground through capacitor 62. The effect of inductance Lm being switched into the circuit by coupling to AC ground through capacitor 62 is to reduce the effective inductance of inductors 38 and 40 for tuning the higher frequency band B2.

When a selected channel is in band B1, bandswitching PIN diode 58 is made non-conductive (signal BS1 is relatively low) and the tuned circuit for band B1 is formed having the maximum inductance including all of inductors 36, 38, and 40 with mutual inductance Lm being switched out of the circuit.

Bias circuitry for transistor 46 is not shown. Gate 47 of transistor 46 typically is provided with an AGC signal, the circuitry for providing such an AGC signal is not shown.

Figure 3:
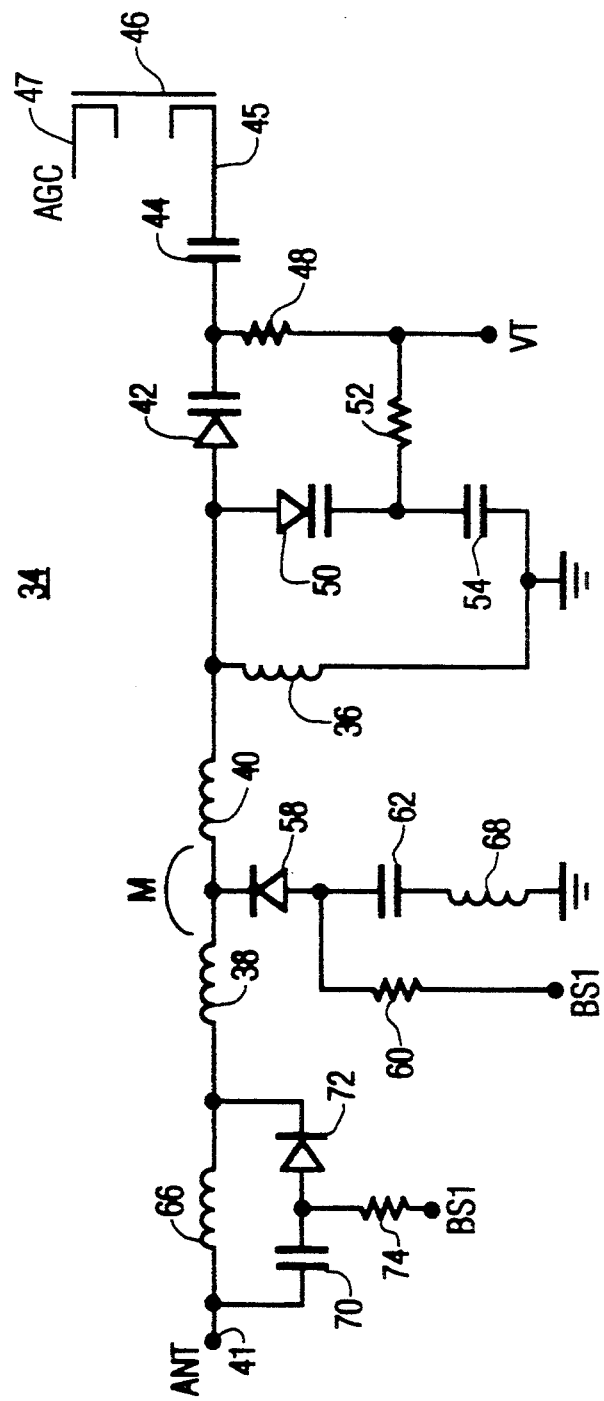
FIG. 3 is a schematic of a VHF tuning circuit for the VHF amplifier of FIG. 1, according to aspects of the present invention.

Referring now to FIG. 3 wherein like members corresponding to FIG. 2 have been designated with like numerals, tuning circuit 34 includes four inductors 36, 38, 40, and 66, and varactor diodes 42 and 50 coupled between signal input 41, and via a DC isolation capacitor 44, to the gate electrode 45 of FET transistor 46. Varactor diode 50 is coupled from the junction of varactor diode 42 and inductor 40 to ground through DC isolation capacitor 54. Inductor 36 is coupled from the junction of varactor diode 42 and inductor 40 to ground instead of between input terminal 41 and the reference potential (ground). Tuning voltage VT, from channel selector 24, is coupled to the cathodes of varactor diodes 42 and 50 as discussed above in connection with FIG. 2. Inductor 36 provides a return path for varactor diodes 42 and 50.

Inductor 66 is coupled in series between input terminal 41 and inductors 38 and 40. A bypass capacitor 70 and PIN diode 72 are coupled in series across inductance 66. When the BS1 signal is applied to the junction of capacitor 70 through resistor 74, diode 72 switches capacitor 70 across inductor 66 when band B2 is selected, thus bypassing inductance 66. This has the effect of reducing the inductance in the circuit when the higher frequency band B2 is chosen. Other aspects of bandswitching and channel tuning are accomplished as discussed above in connection with FIG. 2.

Inductors 38 and 40 have a mutual inductance coupling and generate an equivalent of mutual inductance Lm, as discussed above. However, in the circuit of FIG. 2, the value of mutual inductance Lm is slightly less than desired even with maximum coupling between inductors 38 and 40. The less-than-desired value of Lm causes a slight roll-off at the upper frequencies of the higher VHF band B2. To overcome this problem, a small inductor 68 is added in series with Lm to ground when diode 58 is conducting. In the exemplary embodiment, inductor 68 is a small inductance formed in the copper circuitry of the printed circuit board (not shown) upon which the circuitry is wired.

The circuit position for inductor 36 is changed from FIG. 2 because it is desirable that a tuning circuit exhibit as much constant bandwidth across the tuning range as is practicable. In an RF circuit, a series inductance tends to exhibit constant bandwidth whereas a shunt inductance tends to exhibit constant resistance. Thus the position of inductor 36 has been moved from being directly coupled to ground across terminal 41 to being after inductances 38 and 40 in order to exhibit the constant resistance effect in a less detrimental manner. Additionally, to improve an constant bandwidth frequency characteristic of tuning circuit 34, series inductor 66 is added, in series, for band B1 and to boost the circuit inductance at the lower frequencies for providing a flatter low frequency tuning response.

What is claimed is:

1. In a television apparatus signal selecting apparatus comprising:

signal source of radio frequency carrier signals, a signal path coupled between an input terminal for receiving said carrier signals and an amplifying means for amplifying said carrier signals, a first control means for supplying a tuning signal having different magnitudes corresponding to respective radio frequency carrier signals, said signal path including first signal selecting means coupled between said input terminal and said amplifying means, said first signal selecting means comprising first, second and third inductances coupled in series in the order named, second signal selecting means coupled to said signal path at a point between said first signal selecting means and said amplifying means, said second signal selecting means including a fourth inductance coupled between said point and a reference potential, and further including means responsive to said tuning signal for varying the response of said first and second signal selecting means, said second and third inductances being mutually coupled, and a fifth inductance coupled between a junction of the second and third inductances to a point of reference potential.

2. In a television apparatus, signal selecting apparatus comprising:

signal source of radio frequency carrier signals in a first and second frequency bands, a signal path coupled between an input terminal for receiving said carrier signals and an amplifying means for amplifying said carrier signals, a first control means for supplying a tuning signal having different magnitudes corresponding to respective radio frequency carrier signals, said signal path including first signal selecting means coupled between said input terminal and said amplifying means, said first signal selecting means comprising first, second and third inductances coupled in series in the order named, second signal selecting means coupled to said signal path at a point between said first signal selecting means and said amplifying means said second signal selecting means including a fourth inductance coupled between said point and a reference potential, and further including means responsive to said tuning signal for varying the response of said first and second signal selecting means.

a second control means for generating bandswitching signals, the second and third inductances having a first junction therebetween, a first switching means for selectively coupling the first junction to said point of reference potential in response to a bandswitching signal, and second switching means for selectively shunting said first inductance in response to said bandswitching signal for bandswitching said first and second signal selecting means into a circuit configuration corresponding to a the second frequency band higher in frequency than the first frequency band.

3. The apparatus of claim 2 wherein said first switch means comprises a first switching diode and a first capacitor coupled in series to the first junction, and said second switching means comprises a second switching diode and a second capacitor coupled in series at a second junction across said first inductor, the bandswitching signal being coupled to the second junction.

4. In a receiver, apparatus comprising:

signal source of radio frequency carrier signals in a frequency band;

a signal path between an input terminal for receiving said carrier signals and an output terminal including amplifying means for amplifying said carrier signals, a first control means for supplying a tuning signal having different magnitudes corresponding to respective radio frequency carrier signals, a second control means for generating bandswitching signals, first signal selecting means coupled to said signal path at a first point between said input terminal and said amplifying means, said first signal selecting means comprising first, second and third inductors coupled in series in the order named, first switching means for selectively shunting said first inductor in response to said bandswitching signal, the second and third inductors having a first junction therebetween, a second switching means for selectively coupling the first junction to said point of reference potential in response to said bandswitching signal, second signal selecting means coupled to said signal path at a second point between said first signal selecting means and said amplifying means, said second signal selecting means including a fourth inductor coupled between said second point and a reference potential, and further including means responsive to said tuning signal for varying the response of said first and second signal selecting means.

5. The apparatus of claim 4 wherein said first switch means comprises a first switching diode and a first capacitor coupled in series at a second junction, said bandswitching signal being coupled at the second junction, and said second switching means comprises a second switching diode and a second capacitor coupled in series to the first junction.

6. The apparatus of claim 4 wherein said second signal selecting means includes a variable capacitance means for exhibiting a capacitance responsive to said tuning signal.

7. The apparatus of claim 4 wherein said second and third inductances are mutually coupled and further comprising a fifth inductance coupled between the first junction to a point of reference potential.

8. The apparatus of claim 4 wherein said means responsive to said tuning signal includes first capacitance means coupled across said fourth inductor and a second capacitance means coupled between the second signal selecting means and said amplifying means.

* * * * *